(12) United States Patent
Igaki et al.

(10) Patent No.: US 6,479,763 B1
(45) Date of Patent: Nov. 12, 2002

(54) CONDUCTIVE PASTE, CONDUCTIVE STRUCTURE USING THE SAME, ELECTRONIC PART, MODULE, CIRCUIT BOARD, METHOD FOR ELECTRICAL CONNECTION, METHOD FOR MANUFACTURING CIRCUIT BOARD, AND METHOD FOR MANUFACTURING CERAMIC ELECTRONIC PART

(75) Inventors: Emiko Igaki, Amagasaki (JP); Masakazu Tanahashi, Osaka (JP); Takeshi Suzuki, Izumi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/530,466

(22) PCT Filed: Aug. 26, 1999

(86) PCT No.: PCT/JP99/04595

§ 371 (c)(1),
(2), (4) Date: Apr. 28, 2000

(87) PCT Pub. No.: WO00/13190

PCT Pub. Date: Mar. 9, 2000

(30) Foreign Application Priority Data

Aug. 28, 1998 (JP) .......................................... 10-244151
Nov. 16, 1998 (JP) .......................................... 10-324699

(51) Int. Cl.[7] .............................. H01R 12/04; H05K 1/11
(52) U.S. Cl. ...................... 174/262; 174/260; 174/264; 361/760; 361/779; 361/803; 29/832; 257/698; 428/313.5
(58) Field of Search ................................. 174/262, 264, 174/260, 265; 361/760, 751, 763, 779, 803; 257/698, 697; 428/313.3, 313.5, 313.9, 317.9, 327, 328, 402.2, 402.21, 402.22, 403, 404, 406, 407; 29/832

(56) References Cited

U.S. PATENT DOCUMENTS

| | | | |
|---|---|---|---|
| 4,139,881 A | * 2/1979 | Shimizu et al. | 361/400 |
| 4,383,363 A | * 5/1983 | Hayakawa et al. | 29/847 |
| 4,991,060 A | * 2/1991 | Kawakami et al. | 361/410 |
| 5,200,579 A | * 4/1993 | Takeuchi | 174/256 |
| 5,283,104 A | * 2/1994 | Aoude et al. | 428/195 |
| 5,326,636 A | * 7/1994 | Durand et al. | 428/323 |
| 5,346,750 A | 9/1994 | Hatakeyama et al. | |
| 5,481,795 A | 1/1996 | Hatakeyama et al. | |
| 5,698,015 A | * 12/1997 | Mohri et al. | 252/512 |
| 5,714,238 A | * 2/1998 | Komagata et al. | 428/208 |
| 5,855,820 A | * 1/1999 | Chan et al. | 252/511 |
| 6,096,411 A | * 8/2000 | Nakatani et al. | 428/209 |
| 6,139,777 A | * 10/2000 | Omaya et al. | 252/500 |

FOREIGN PATENT DOCUMENTS

| | | |
|---|---|---|
| GB | 1577912 | 10/1980 |
| JP | 53-88193 | 8/1978 |
| JP | 61-113629 | 5/1986 |
| JP | 1-232735 | 9/1989 |
| JP | 04-239709 | 8/1992 |
| JP | 05-67868 | 3/1993 |
| JP | 06-139817 | 5/1994 |
| JP | 6-268345 | 9/1994 |
| JP | 07-307351 | 11/1995 |
| JP | 08-78803 | 3/1996 |
| JP | 08-162359 | 6/1996 |
| JP | 09-153514 | 6/1997 |

OTHER PUBLICATIONS

Japanese search report for PCT/JP99/04595 dated Dec. 14, 1999.
English translation of Form PCT/ISA/210.

* cited by examiner

Primary Examiner—David L. Talbott
Assistant Examiner—I. B. Patel
(74) Attorney, Agent, or Firm—RatnerPrestia

(57) ABSTRACT

A conductive paste containing: conductive particles; foamable material which foams at the time of heating or decompression; and resin; characterized in that even after foaming of the foamable material, conductivity is maintained.

39 Claims, 12 Drawing Sheets

(A)

(B)

(A)

(B)

(A)

(B)

(A)

(B)

(C)

(D)

CONDUCTIVE PASTE, CONDUCTIVE
STRUCTURE USING THE SAME,
ELECTRONIC PART, MODULE, CIRCUIT
BOARD, METHOD FOR ELECTRICAL
CONNECTION, METHOD FOR
MANUFACTURING CIRCUIT BOARD, AND
METHOD FOR MANUFACTURING
CERAMIC ELECTRONIC PART

This application is a U.S. National Phase Application of PCT International Application PCT/JP98/04595.

TECHNICAL FIELD

This invention relates to conductive paste, etc. to be used for mounting to substrates of electronic parts or inter-electrode joint, etc.

BACKGROUND ART

Conventionally, conductive adhesive agents which have been used for mounting onto substrates of electronic parts or for inter-electrode joint, whose purpose is fixation and electrical connection, therefore, generally have comprised metal particles such as conductive silver and copper, etc., having been made to disperse in a viscous resin for fixation or cure-type resin paste.

To make joint effective, it is important that an adhesive agent and the surface of adherend gets sufficiently closer on a micro level. In case of an adhesive type, resins which are flexible, easily deformed and has high affinity with the surface of adherend have been used, while in case of a cure type, resins which have high fluidity and wetness has been used. This enables an adhesive agent to enter the recess and salient of adherend having unit of a micro level and attain good joint in case of either adhesive type or cure type.

On the other hand, for conductive particles, particles in various shapes have been used according to their use, those of adhesive type as well as cure type have been required to be with low resistance so that good electric connection is obtainable, and have been arranged so as to improve the content ratio of conductive particles in the adhesive agent, and remove bubbles, and increase volumetric occupation ratio of conductive particles.

In addition, as concerns cure type, because volume shrinkage takes place at the time of curing, for the purpose of relieving the resultant internal stress, addition of plasticizers, etc., has been implemented as well.

In general, an electrical joining method involving conductive adhesive agents is being used in various fields for its simple nature, and recently, since resins themselves or additions of plasticizers show flexibility, the method is being in wide use as an electric connection method for portions where thermal as well as mechanical strain is apt to occur. In addition, the electric joint method using conductive adhesive agents is remarkably applied and extended to terminal electrodes for small-sized electronic parts and mounting of electronic parts onto substrates. As an example, an embodiment of mounting onto substrates has been disclosed in Japanese Patent Laid-Open No. 1-232735 specification.

However, in case of conventional conductive adhesive agents, whose conductivity is maintained by contact among conductive particles, there was a problem that stress was generated when expansion and shrinkage took place due to heating or when the substrates were bent, and at the time of stress relief thereof the contact among particles was removed to heighten resistance.

In addition, since electric connection to electrodes to be connected has been conducted with contact between conductive particles and electrodes, there has been a problem that not only being weak against stress as described above but also in some cases, surface resistance between electrodes and adhesive agents would become greater from the initial period.

On the other hand, in recent years, in correspondence with miniaturization as well as higher performance of electronic equipment, not only for industrial use but also in a vast field of equipment for commercial use, it has been strongly desired that multilayer wiring circuit substrates on which semiconductor chips such as LSI, etc., can be mounted with higher density are supplied. In such a multilayer wiring circuit substrate, it is important that electric connection can be attained with highly connection reliability among wiring patterns of plural layers formed with fine wiring pitch.

To comply with such demand from the market, in stead of metal-plated conductor on the inner wall of through hole, which has been the main stream of inter-layer connection of conventional multilayer wiring substrate, there is an inner via hole connection method that enables optional electrode on a multilayer print wiring substrate to be interlayer-connected in optional wiring pattern position, that is, whole layer IVH structural resin multilayer substrate (Japanese Patent Laid-Open No. 06-268345 specification). This one, in which conductive body filling in via holes of a multilayer print wiring substrate can connect only respective necessary layers and inner via hole can be disposed right under the part land, thus, can realize miniaturization of substrate sizes as well as mounting with high density.

However, a general inner via hole connection method is implemented by squeegee-printing the conductive paste which fills in inside the via holes, and especially for filling conductive paste toward via holes with micro diameters the viscosity characteristics of conductive pastes are supposed to play an important role. In conductive pastes for via hole filling, printing characteristics and conductivity in inter-layer connection oppose each other from the point of view of structural materials.

That is, when composition ratio of conductive particle among fine particles is increased for the purpose of improving conductivity, resin components are absorbed on the surface of conductive particle, resulting in increase in viscosity of the paste, and thus printing becomes less easy. In addition, when conductive particles with small surface area, that is, greater particle diameter are used, or structural ratio of conductive particles is decreased for the purpose of lowering viscosity of the paste to improve printing characteristics, contact surface area between conductive particles themselves becomes smaller, thus a problem on connection reliability occurs. That is, as concerns conductivity in a conductive paste, with conductive particles coming into point contact each other, and since electric connection between electrode foils disposed on the upper surfaces of via holes and conductive particles depends on point contact between conductive particles and the electrode foils as well, thus, when in particular the wiring pattern in terms of line width as well as distance between lines have been made minute, accordingly diameters of via holes have been made minute as well, it becomes extremely difficult to secure high connecting reliability in inter-layer connection among multilayer wirings.

DISCLOSURE OF THE INVENTION

The purpose of the present invention is to solve issues such as the foregoing to provide conductive paste, etc., which has low resistance and can tolerate stress so as to enable the conductive structure to be formed.

First and foremost, conductivity of, for example, an adhesive agent, which is a typical example of conductive paste, is given by mutual contact of conductive particles dispersed in the adhesive agent. In addition, electrical connection with electrodes to be connected is given by contact between conductive particles in the adhesive agent and electrodes. Accordingly, as the contact area between conductive particles as well as the contact area between conductive particles and electrodes is greater, better electric connection with smaller resistance can be obtained.

In a conductive adhesive agent, foamable resin powder, for example, is contained as a foamable material, and when the foamable resin powder foams by heating or decompression, as a macro structure, the volume content ratio of conductive particles in the adhesive agent decreases. However, micro-structurally, contact area between conductive particles as well as between conductive particles and electrodes can be made equal to or more than the contact area in the case where no foamable resin powder is contained. This can be attained by adopting a method of construction such as in the method of the present invention, that the foamable resin powder undergoes foaming prior to curing of the resin, and subsequently undergoes curing in the case where the cure type of the conductive adhesive agent of the present invention is used in such a place that it can expand freely. At that time, the contact between conductive particles, which is defined by hardening shrinkage of resin in the portion other than the air bubble created by foaming, changes little compared with in the case where foamable resin powder is not contained, and in addition the number of joint points between conductive particles is not significantly decreased. Therefore, the contact area between conductive particles for the entire layer of the conductive adhesive agent will become approximately same. This will increase in the entire volume of the layer of the conductive adhesive agent to be increased in apparent specific resistance, but the value of the resistance will not increase much, giving rise to those being conductive approximately on the same level.

On the other hand, in such the case where a conductive adhesive agent is inserted in the gap having a fixed distance to undergo curing, when a conventional conductive adhesive agent is used, the spacing regulation will hamper the hardening shrinkage for the entire conductive adhesive agent layer, and hamper the normally expected increase in the contact area between conductive particles by the hardening shrinkage. Such a case will only end with a simple expansion or give rise to gaps, resulting in the connection with high resistance values. In contrast,when a conductive adhesive agent of the present invention is used, the bubble portions expand more than the conductive portions other than bubbles hardening shrinkage, and thus, compared with in a conventional case, in a limited space, stronger compression stress is generated and raises pressure in the portions other than bubbles. This increases contact area between conductive particles and between a conductive particle and an electrode to which the particle is attached more than in the conventional ones without generating any gaps to make it possible to attain lower resistance with a good joint condition. In this case, the apparent specific resistance also becomes smaller.

This serves to make it possible to provide adhesive agents having conductivity equal to or more than those in the case where no foamings take place as far as content ratio of foamable resin powder to be included does not become too excessive.

At the same time thereof, in the case where the adhesive agent has been made to contain foamable resin powder, the structural body after the foaming will become a network structure having a lot of small pores internally and comprising conductive particles and adhesive agent resin. A structural body having a number of pores is extremely abundant in flexibility and can be easily deformed against stress to relieve stress. This stress relief is proceeded mainly by deformation of pores, the strength to set contact between conductive particles as well as joint with electrodes apart greatly damps. Accordingly, also when strain has been given, it becomes possible to continue holding good electrical connection.

As described above, with foamable material being contained in conductive adhesive agent, it becomes possible to provide conductive paste which shows good strain-stress resistant characteristics and has low resistance.

In order to attain the above-described objects, provided is the conductive paste of the present invention which contains conductive particles, foamable materials foaming at the time of heating or depressing, and resin, and maintains good conductivity as an electrical connection material even after the expansive materials expand, that is, the conductive paste of the present invention is characterized by being able to maintain the resistance ratio per volume which is not less than $10^{-6}$ $\Omega$*cm and not more than $10^{-2}$ $\Omega$*cm.

In addition, the present invention covers conductive structures using such conductive paste, electronic components, mounting bodies, circuit substrates, an electric connection method, forming method of circuit substrate, and forming method of ceramic electronic components.

BRIEF DESCRIPTION OF THE DRAWINGS

FIGS. 11 and 11B are partially enlarged cross-section views of a circuit substrate showing the configuration of conductive paste for filling via holes in an embodiment of the present invention.

DESCRIPTION OF SYMBOLS

Figure 1:
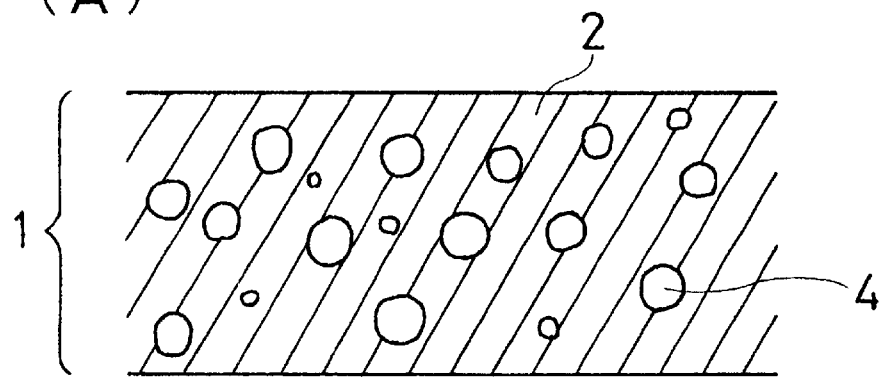
FIGS. 1A–1B are cross-section views (FIG. 1A) showing the structure of a conductive adhesive agent layer and (views FIG. 2B) showing a minute structure thereof in an embodiment according to the present invention.
Figure 1:
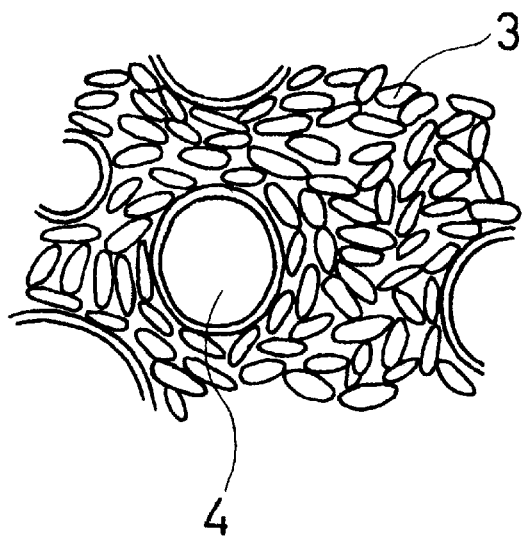

1 Conductive adhesive agent layer
2 Structural body which conductive particles and resin form
3 Conductive particles
4 Small pore after foamable resin powder has foamed
5 Hollow resin particle
6 Shell wall
7 Low boiling point hydrocarbon
8 Pore
10 Insulating substrate
20 Through hole
30 Conductive paste for filling via holes
40 Copper foil
50 Conductive particle
60 Hollow synthetic resin particle
70 Gas, liquid, or solid
80 Microcapsule
90 Heat curing resin
100 Via hole conductor

BEST MODE FOR CARRYING OUT THE INVENTION

Embodiments according to the present invention will be explained in detail with reference to the drawings as follows.

A conductive adhesive agent being an embodiment of conductive paste of the present invention disperses conductive particles having conductivity into viscous resin or cure type resin.

That conductive particles, which are not limited to certain kinds if they are metal particles being used for general conductive adhesive agent, however, are preferably made from metallic particles of at least one kind to be selected from gold particles, silver particles, copper particles, tin particles, indium particles, palladium particles, nickel particles or lead particles, or alloy particles made therefrom in any combination. Among them, gold particles, silver particles, or indium particles are further preferable since in the case where a metal itself is soft, the contact area is apt to be extended when compressive force is applied. In addition, in the case where solder particles have been used as a heat and cure type, at the time of heating, mutual interfaces of particles are fused to conduct metallic bond, which is advantageous to make resistance lower. On the other hand, taking advantage of the fact that corrosiveness does not exist, carbon particles can be preferably utilized as well. Moreover, particles configured to comprise resin particles, other metal particles, or ceramic particles on the surfaces of which the above-described metal, namely at least one kind of metal to be selected from gold, silver, copper, tin, indium, palladium, nickel, or lead, or alloy made therefrom in any combination has been coated are preferably utilized as well.

Viscous resin to be used is not limited to a certain kinds if they are being used for pressure-sensitive adhesive tapes in general, such as an acrylic line of goods, a vinyl line of goods, and a rubber line of goods, etc.

Cure type resin to be used is not limited to a certain kinds if they are being used for cure type adhesive agents in general, such as a phenol line of goods, an epoxy line of goods, a silicone line of goods, an acryl line of goods, a polyimide line of goods, an acrylic ester line of goods, an amido line of goods, a rubber line of goods, and a vinyl line of goods, etc.

Moreover, the conductive adhesive agent of the embodiment according to the present invention is obtained by making a resin into which the above-described conductive particles have been dispersed contain foamable resin powder which foams at the time of heating or decompression.

In the case where the conductive adhesive agent containing this foamable resin powder is used to proceed with, for example, connection and fixation between electrodes on a substrate, the contained foamable resin powder foams and expands subject to heating process or decompression treatment process.

As shown in FIG. 1(A), the conductive adhesive agent layer 1 to be formed at that time will take expansion configuration in which there are a lot of small pores 4 in the structural body 2 which conductive particles and resin form. As shown in FIG. 1(B), microstructure is to be configured so that the conductive particles 3 may be linked in a network configuration, and the conductive particles 3 exist so as to cover the small pores 4 which has been formed after foamable resin powder has foamed.

Adopting the network configuration having such a number of small pores 4, the conductive adhesive agent layer 1 is supplied with flexibility, and is easily deformed at the time when strain is loaded, and it becomes feasible to relieve the stress in the adhesive agent layer 1.

In this case, compared with a conductive adhesive agent layer which is not made to contain the foamable resin powder, as a macrostructure the volume content of the conductive particles 3 in the adhesive agent decreases. However, the number of entire particles remain almost the same since it depends on the quantity of application, and micro-structurally, contact surface area between conductive particles 3 as well as between conductive particles 3 and electrodes being the body to which the particles are attached can be made equal to or more than the contact surface area in the case where no foamable resin powders are contained. This occurs because, as described before, when the distance is limited, compressive stress is generated between conductive particles 3 as well as between conductive particles 3 and electrodes being the body to which the particles are attached due to expansion strength at the time when foamable resin powders foam, and thus they are tightly stuffed each other to increase contact area.

On the other hand, also in the case where free expansion can take place, for example, even in the case where the foaming makes the entire volume larger, that does not mean a simple expansion, and since the portions other than bubbles remain almost unchanged, as a consequence, mutual contact area will become approximately the same.

This will make it possible to reveal conductivity equal to or more than conventional case as far as content of foamable resin powder to be included does not become too excessive.

Moreover, the stress relief at the time of strain loading is proceeded mainly by deformation of the small pores 4, the strength to set contact between conductive particles 3 as well as joint with electrodes apart greatly damps. Accordingly, also when strain has been given, it becomes possible to continue holding good electrical connection.

Incidentally, in the case where resin to be used as conductive adhesive agent is a heat and cure type, foaming of foamable resin powder and curing of the adhesive agent can be proceeded simultaneously. When the adhesive agent gets cured at the time of heating entirely, the foamable resin powder becomes no longer foamable. For the purpose of avoiding that, such methods that the low temperature heat process is separately provided, or the foaming is arranged to take place in the course of competition against curing, are adaptable. In case of other cure types, they can be easily foamed with heat treatment process to be separately provided before cure processing.

In addition, the method that foamable resin powder is caused to foam by reduced pressure can be also adopted, and when this method is adopted, there is an advantage that foaming process and cure process can be separately controlled.

Also in the case where resin to be used for a conductive adhesive agent is an adhesive type, it can be easily foamed with heat treatment process or decompression treatment process to be separately provided. Here unlike a cure type, compression stress due to cure shrinkage of resin layer does not extend any influence, thus initial resistance tends to get more or less bigger, but sufficient conductivity and stress relief effect will be able to coexist.

Figure 3:
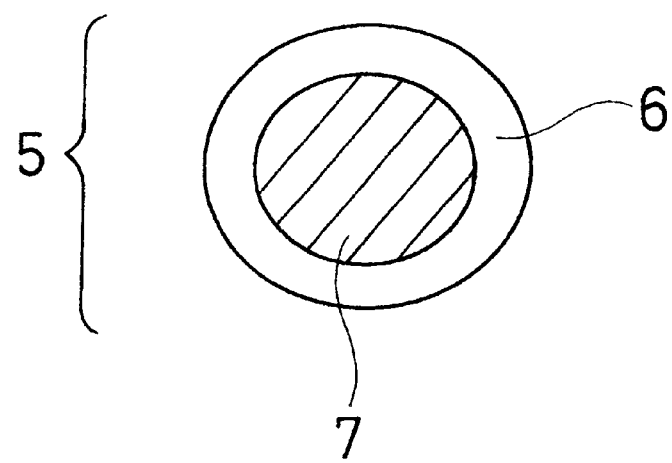
FIG. 3 is a cross-section view showing the structure of an foamable resin powder in an embodiment according to the present invention.

As shown in FIG. 3, foamable resin powder to be contained in conductive adhesive agent preferably comprises microcapsules that comprise hollow resin particles 5 having shell walls 6 within which a substance such as low boiling point hydrocarbon 7 expandable by heating or decompression is contained. Incidentally, expansion shall include decomposition and evaporation.

Now, in case of heat foaming, as a configuring resin, which is not limited to certain kinds if they are softened by low temperature heating, vinylidene chloride and acrylic-related resin, etc. are preferable. This makes expansion at a low temperature easier and handling will become easier. Especially, in case of heat and cure type, sufficient expansion prior to dehydration or curing, and expansion configuration which can relieve stress is attainable. On the other hand, in case of decompression foaming, a configuring resin is preferably resin, such as polyethylene, etc., deformation of which is easible under a normal temperature, and with softness.

Here, content quantity of foamable resin powder to be contained in conductive adhesive agent is set at 0.001 to 0.5 volume ratio per unit quantity of conductive particle in an adhesive agent, on the basis of volume prior to foaming, which enables the above-described stress-resistant effect. With volume ratio of less than 0.001, it practically does not show any stress-relief effect, and with volume ratio of more than 0.5, the number of conductive particles per unit volume of conductive adhesive agent layer dramatically decrease, and consequently characteristics of resistance will show a considerably low state from the initial period of forming even if any deflection does not take place. Further preferably, it would be better if content quantity of foamable resin powder attains, on the basis of volume, 0.01 to 0.1 volume ratio against quantity of conductive particles in the adhesive agent. The related experimental evidence will be described later.

Moreover, for the purpose of attaining good stress-resistant characteristics consistent with low resistance characteristics, it is necessary to disperse the small pores 4 as much as possible. Therefore, the diameter of a particle of foamable resin powder prior to foaming is preferably not less than 1 $\mu$m and not more than 50 $\mu$m so that the number of conductive particles per unit volume of conductive adhesive agent layer is not dramatically reduced. This makes it possible to attain an expansion structure enabling stress relief without causing resistance characteristics to deteriorate. The related experimental evidence will be described later. Incidentally, the diameter of a particle easily susceptible to kneading is not less than 1 $\mu$m.

In addition, the volume expansion ratio of foaming of foamable resin powder is preferably over 1 time and not more than 100 times. At the time of curing, compressive stress sufficiently acts between conductive particles as well as between conductive particles and electrodes also when foamable resin powders foam, and thus decrease in resistance can be planned. But when the expansion ratio exceeds 100 times, the number of conductive particles per unit volume of conductive adhesive agent layer dramatically decrease, and consequently characteristics of resistance terribly deteriorate. The related experimental evidence will be described later.

In addition, a cavity in the formed conductive adhesive agent layer 1 (conductor) preferably has the size of not less than 1 $\mu$m and not more than 100 $\mu$m, and the ratio thereof for the whole conductor volume is 3 to 50 vol %.

In the case where a cavity has the size less than 10 $\mu$m, and the ratio is less than 3 vol % against the conductor volume, stress relief extends less influence, and cannot maintain good electric connection when deformation takes place. In addition, in the case where the ratio exceeds 50 vol %, the volume content of conductive particle components decreases too much, giving rise to an inconvenience that the initial electric resistance is heightened. At this time, in the case with cavities of less than 1 $\mu$m or with those of more than 100 $\mu$m, in spite of the occupying volume ratio thereof within a range of 3 to 50 vol %, a flat stress relief influence could not be given and when deformation took place, increase in electric resistance was confirmed. The related experimental evidence will be described later.

Incidentally, in the above-described embodiment, foamable resin powder has been used as a foamable material of the present invention, but the foamable material is not limited to foamable resin powder. In short, for the foamable material those forms of powder, particle, or liquid will do if they foams at the time of heating or decompression. Thus, although the foamable material may not be foamable resin powder, the content quantity of the foamable material prior to foaming should be such quantity that makes the volume ratio against 1 quantity of conductive particle 0.001 to 0.5. In addition, the diameter of a particle of foamable material prior to foaming should be not less than 1 $\mu$m and not more than 50 $\mu$m. Moreover, the volume expansion ratio of foaming of foamable material due to heating or decompression should be over 1 time and not more than 100 times.

In addition, in the above-described embodiment, as the substance for the present invention expanding at the time of heating or decompression, low boiling point hydrocarbon has been used, but as described above, in the present application, expansion shall include decomposition or evaporation, and therefore, as the substance expanding at the time of heating or decompression, a hydrate of inorganic compounds, etc., such as a hydrate of cuprous chloride, for example, can be used. In addition, for example, baking soda (sodium acid carbonate) can be used. In addition, as an organic substance, other than the low boiling point hydrocarbon, camphor, sodium citrate, halogenated hydrocarbon, azo-dicarvoneamido, etc. can be used.

In addition, an electrical connection method related to the present invention has made electronic parts as well as electrodes to attain connection in good strain-resistant stress characteristics and with low resistance by proceeding with electric connection in use of a conductive adhesive agent according to the above-described configuration.

For example, the method is the one which is used when two different electrodes on a substrate are connected electrically, wherein such two electrodes are connected using the above-described conductive adhesive agent, and thereafter the conductive adhesive agent is heated or decompressed to foam the foamable materials contained in the conductive adhesive agent. Incidentally, in case of heat and cure type conductive adhesive agent, at the time of heating the conductive adhesive agent, heating may be conducted only once to cause the foamable materials such as foamable resin powder, etc. to foam as well as cure the conductive adhesive agent itself, and for example, low temperature heat process as well as high temperature heat process may be provided so as to cause foamable materials to foam during the low temperature heat process and the conductive adhesive agent itself to be cured during the high temperature heat process. Moreover, a heat process may comprise not less than 3 processes. In addition, as a foaming process, decompression treatment process may be provided separately.

As explained above, in the case where a conductive adhesive agent of an embodiment according to the present invention has been used to mount electronic parts onto a substrate, connections between conductive particles themselves in the conductive adhesive agent layer and between an electrode on the substrate party and a conductive particle will not be set apart even when the substrate was mechanically as well as thermally deformed, thus highly reliable electric connection without any increase in resistance can be attained. Especially, in the case where as conductive particles, resin particles on the surface of which has been coated with metal have been used, strain-resistant stress characteristics are extremely improved.

Figure 4:
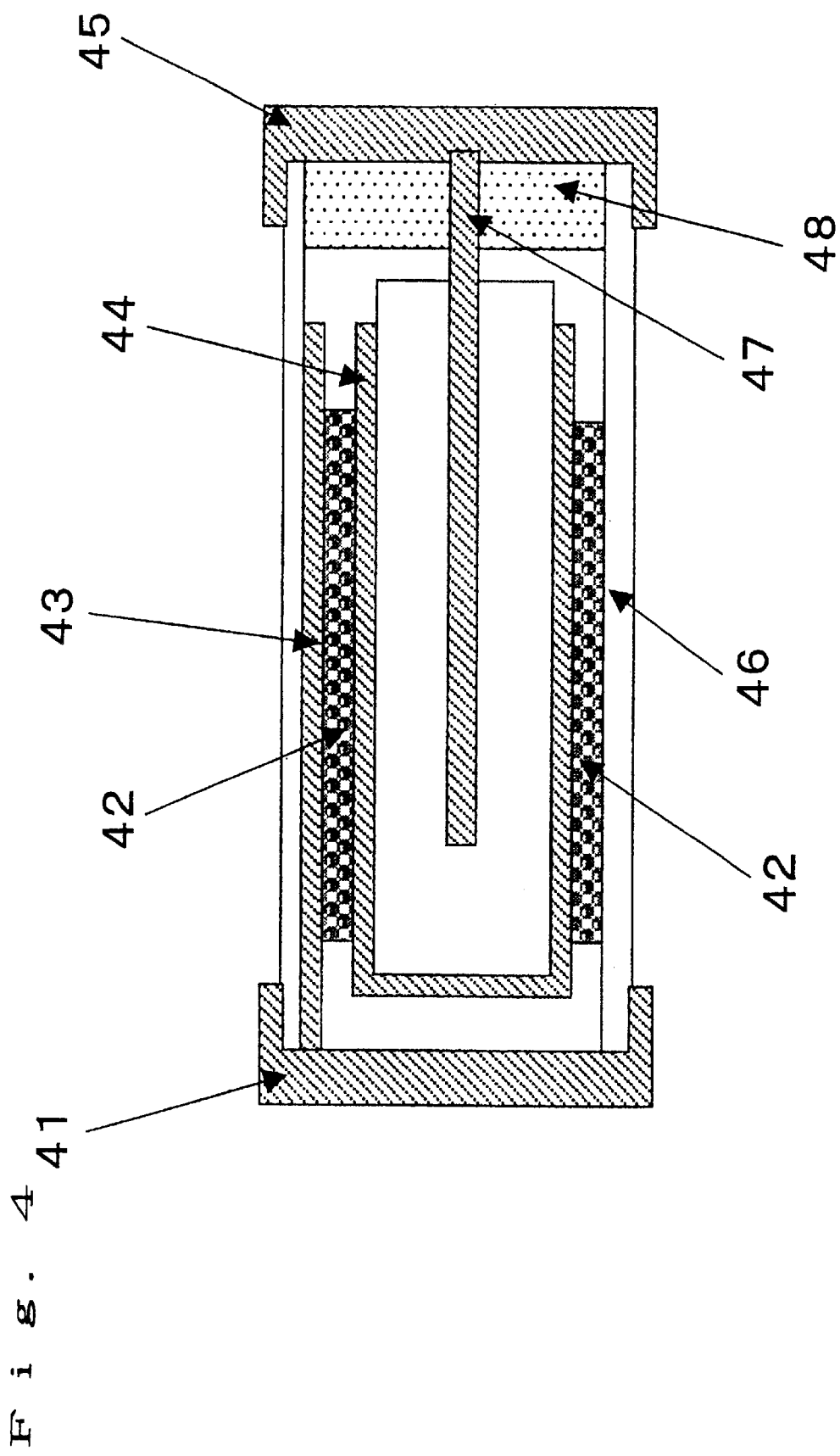
FIG. 4 is a cross-section view showing a capacitor in an embodiment of the present invention.
Figure 5:
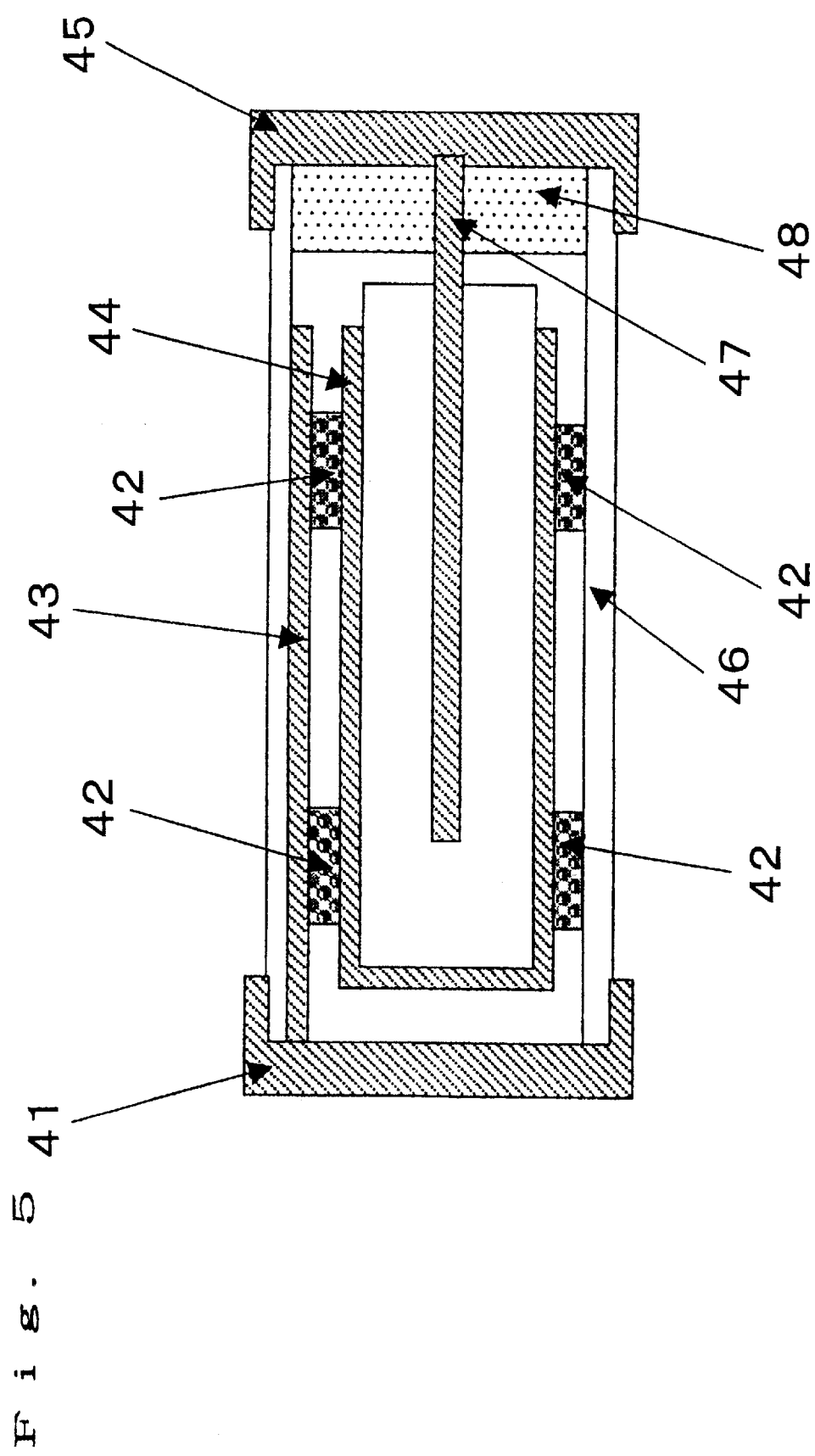
FIG. 5 is a cross-section view showing a capacitor in an embodiment of the present invention.

In addition, in the case where electric connection between electrodes disposed at a constant distance facing each other is implemented with a conductive adhesive agent, at time when the conductive adhesive agent of the above-described embodiment according to the present invention is used, and when the foamable material foams, the adhesive agent expands between the electrodes, thus it becomes possible to easily connect the electrodes together (refer to FIGS. 4 and 5).

In this case, the foamable material foams so as to expand entire adhesive agent layer and to make bonding between the electrodes easier, and at the same time, compression stress is of course generated between conductive particles themselves as well as between conductive particles and electrodes, therefore contact area between respective conductive materials can be enlarged, and thus such an effect that resistance lowering of the conductive adhesive agent layer as well as resistance lowering of surface resistance against electrodes can be planned, is attainable.

In addition, in the case where the exterior electrode is formed at the end portion of such as a ceramic electronic component having electrodes internally, the exterior electrode is arranged to have cavities by usage of conductive adhesive agent of the above-described embodiment according to the present invention so that also at the time of occurrence of deflection the electronic component can show highly reliable performance without characteristic deterioration or cracks. (refer to FIG. 7 and FIG. 8.) Specific embodiments of the present invention will be explained as follows.

(Embodiment 1)

As the conductive adhesive agent, one-liquid heat and cure type silver adhesive agent which is on the market has been prepared. In addition, as a foamable resin powder as one of foamable materials, microcapsules which have such a configuration that, hollow resin particles 5 as shown in FIG. 3 have been filled with low boiling point hydrocarbon 7, and foam at around 100° C., and have an average particle diameter of approximate 20 $\mu$m have been prepared.

And to the silver adhesive agent the foamable resin powder having 0.0001 to 1 volume ratio against the quantity of silver has been added and kneading has been conducted again. That is, adding foamable resin powder so that addition quantity of the foamable resin powder was chosen to attain volume ratio of 0.0001, 0.0005, 0.001, 0.005, 0.01, 0.05, 0.1, 0.5, and 1.0 against silver quantity 1, and kneading was conducted again.

A glass substrate has been coated with the conductive adhesive agent paint having been prepared as mentioned above so as to shape lines with a constant width and the coating thickness of 500 $\mu$m, and thereafter preliminary heating has been conducted at 100° C. to make the foamable resin powder foam, and thereafter, heat and cure has been conducted at 150° C. For the purpose of comparison, in the case where nothing is added to the silver adhesive agent which is on the market, a similar sample has been formed.

Figure 2:
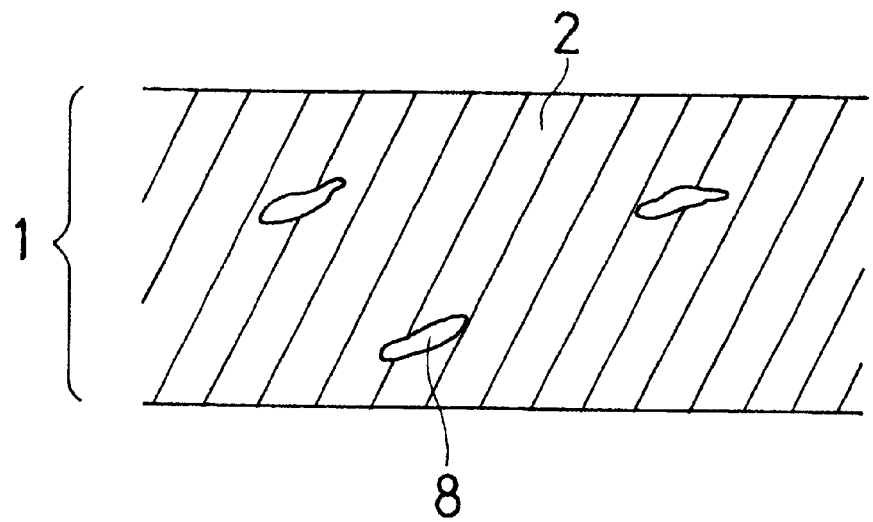
FIGS. 2A and 2B are cross-section views (FIG. 2A) showing the structure of a conductive adhesive agent layer and (FIG. 2B) showing a minute structure thereof in a conventional example.
Figure 2:
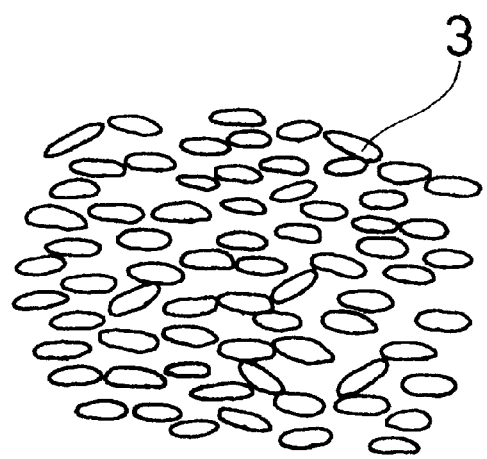

Next, section configurations of lines of the obtained samples have been observed. As shown in FIGS. 2(A) and (B), the section configuration of the conductive adhesive agent layer (silver adhesive agent layer) 1 of the conventional one scarcely has contained the pores 8, and the conductive particles (silver particles) 3 have been evenly dispersed in the resin and in tight contact each other.

On the other hand, as shown in FIG. 1, the section configuration in the case where foamable resin powder has been added to the conductive adhesive agent (silver adhesive agent) has comprised a number of small pores 4 in the conductive adhesive agent layer (silver adhesive agent layer) 1, and the conductive particles (silver particles) 3 have been in tight contact each other at portions other than the small pores 4 as in case of the conventional one. Here, converting from the diameter of foamable resin powder after foaming, the volume expansion ratio of foamable resin powder due to foaming was approximately 50 times.

Next, the line resistance of the obtained samples were assessed. Any of respective resistance values including those on conventional ones were approximately 10 m$\Omega$, but in the case where foamable resin powder of 0.5 volume ratio has been added, the resistance has more or less increased approximately to 30 m$\Omega$ and in case of 1.0 volume ratio, the resistance has extremely increased approximately to 150 m$\Omega$.

Next, flexibility test has been conducted at each silver adhesive agent layer. The test method was set in accordance with JIS C6481, 5.8 Test method for modulus of rupture, and resistance characteristics against flexibility quantity of substrates were assessed. Any of samples using conductive adhesive agent to which foamable resin powder had been added did not show any increase in resistance when the added quantity was not less than volume ratio of 0.001 and they were bent by 20 mm, and stress resistance was good. On the other hand, in conventional goods as well as those with added quantity of the foamable resin powder was less than the volume ratio of 0.001, as of the time when they were bent by approximately 10 mm, increase in resistance was confirmed.

Assessment result is shown in Table 1.

TABLE 1

| | | Line resistance | |
|---|---|---|---|
| Addition quantity | Initial value | At the time of 10 mm deflection | At the time of 20 mm deflection |
| Conventional product | 10 mΩ | 32 mΩ | 450 mΩ |
| 0.0001 | 11 mΩ | 21 mΩ | 230 mΩ |
| 0.0005 | 10 mΩ | 15 mΩ | 115 mΩ |
| 0.001 | 11 mΩ | 12 mΩ | 20 mΩ |
| 0.005 | 11 mΩ | 12 mΩ | 16 mΩ |
| 0.01 | 10 mΩ | 11 mΩ | 13 mΩ |
| 0.05 | 11 mΩ | 11 mΩ | 12 mΩ |
| 0.1 | 12 mΩ | 12 mΩ | 12 mΩ |
| 0.5 | 29 mΩ | 30 mΩ | 30 mΩ |
| 1.0 | 150 mΩ | 155 mΩ | 158 mΩ |

As shown above, within the range of 0.001 to 0.5 volume ratio of addition quantity, good results on both initial resistance and stress-resistant characteristics were obtained.

(Embodiment 2)

The particle diameter prior to foaming will be explained. Similar to Embodiment 1, as the conductive adhesive agent, one-liquid heat and cure type silver adhesive agent which is on the market has been prepared. In addition, as the foamable resin powder, the one similar to Embodiment 1 was prepared. But, those which attained less volume expansion rate due to foaming of the foamable resin powder than in Embodiment 1 were chosen.

Moreover, interms of particle diameter of the foamable powder, various kinds were prepared, which were used for addition after classifying them according to pre-foaming particle diameter of less than 1.0 μm, from 1.0 μm to 10 μm, from 10 μm to 50 μm, and over 50 μm.

And to the prepared silver adhesive agent the respective classified foamable resin powder has been added so as to attain 0.05 volume ratio against silver quantity 1 and the product was kneaded again, and thus the conductive adhesive agent of Embodiment 2 has been produced.

For the conductive adhesive agent paint prepared as described above, assessment was similarly made as in Embodiment1. But, the assessment was conducted by coating in thickness of 200 μm. The volume expansion rate of the foamable resin powder due to foaming was approximately 10 times.

The assessment result will be shown in Table 2.

TABLE 2

| | | Line resistance | |
|---|---|---|---|
| Addition diameter | Initial value | At the time of 10 mm deflection | At the time of 20 mm deflection |
| Conventional product | 30 mΩ | 120 mΩ | 1080 mΩ |
| Less than 1.0 μm | 35 mΩ | 105 mΩ | 950 mΩ |
| 1.0–10 μm | 32 mΩ | 32 mΩ | 35 mΩ |
| 10–50 μm | 35 mΩ | 36 mΩ | 38 mΩ |
| Over 50 μm | 80 mΩ | 180 mΩ | 1250 mΩ |

Here, in the case where foamable resin powder of less than 1.0 μm was used, foamable resin could not be evenly dispersed at the time of rekneading of the adhesive agent paint, and therefore the stress-relief effect was insufficient.

In addition, in the case where foamable resin powder of over 50 μm was used, with thickness of 200 μm, the foamable resin powder would exist locally in the conductive adhesive agent layer, and the initial resistance as well as stress-resistant characteristics were brought out of order.

(Embodiment 3)

The volume expansion rate will be explained. As the foamable resin powder to be added, several kinds thereof which are different in terms of softening temperature of the shell wall of the micro capsule were prepared, and except that they were added respectively, the conductive adhesive agent produced similarly as in Embodiment 1 was prepared as the conductive adhesive agent for Embodiment 3. But addition quantity of the foamable resin power was chosen to attain volume ratio of 0.05 against silver quantity 1.

And subsequently, as concerns the samples for assessment, they were similarly produced as in Embodiment 1. But, the heating and foaming condition for the respective foamable resin powders which are different in terms of softening temperature were changed, and consequently those with the volume expansion rate due to foaming of the foamable resin powder of 50 times, 100 times, and 200 times were obtained.

On the other hand, unfoamable resin balls were prepared, and except that the resin balls were added to the adhesive agent instead of the micro capsules, as in the above-described procedure was implemented, and consequently the conductive adhesive agent with the resin powder having volume expansion rate of 1 (with no expansion to take place) was prepared, and as concerns this adhesive agent, similar assessment sample was produced.

As for the assessment sample which was prepared as described above, line resistance was assessed similarly in Embodiment 1.

Consequently, for the conventional product and those with one time, 50 times, and 100 times, the similar value of approximately 10 mΩ was measured and for that with 200 times, approximately 50 mΩ was measured, and increase in line resistance was confirmed.

However, when flexibility test was conducted similarly as in Embodiment 1, for the conventional product and the product of 1 time, line resistance increased as in case of the conventional product in Embodiment 1 and good resistant characteristics could not be maintained against deflection.

(Embodiment 4)

Cavity volume rate at the joint portion will be explained. In accordance with Embodiment 1, silver adhesive agent paint was prepared by adding predetermined adding quantity of various kinds of foamable resin powder, and used for coating in form of lines with thickness of approximately 500 μm to produce an assessment sample.

The assessment result is shown in Table 3.

TABLE 3

| Pores in a conductive adhesive structure body | | Line resistance | | |
|---|---|---|---|---|
| Pore diameter | Pore quantity | Initial value | At the time of 10 mm deflection | At the time of 20 mm deflection |
| Conventional product | | 10 mΩ | 32 mΩ | 450 mΩ |
| Less than 1 μm | 25 vol % | 11 mΩ | 28 mΩ | 360 mΩ |
| 1–10 μm | 1 vol % | 11 mΩ | 30 mΩ | 400 mΩ |

TABLE 3-continued

| Pores in a conductive adhesive structure body | | Line resistance | | |
|---|---|---|---|---|
| Pore diameter | Pore quantity | Initial value | At the time of 10 mm deflection | At the time of 20 mm deflection |
| " | 3 vol % | 10 mΩ | 15 mΩ | 18 mΩ |
| " | 10 vol % | 11 mΩ | 12 mΩ | 15 mΩ |
| " | 50 vol % | 12 mΩ | 15 mΩ | 18 mΩ |
| " | 60 vol % | 60 mΩ | 80 mΩ | 85 mΩ |
| 10–100 μm | 3 vol % | 10 mΩ | 12 mΩ | 15 mΩ |
| " | 50 vol % | 15 mΩ | 16 mΩ | 18 mΩ |
| Over 100 μm | 3 vol % | 50 mΩ | 80 mΩ | 120 mΩ |
| " | 50 vol % | 150 mΩ | 250 mΩ | 500 mΩ |

From the foregoing assessment results, the following was confirmed on pores in a conductive structure body:

Necessity of not less than 3 vol %: hole volume to a certain quantity is necessary to cause stress-resistant characteristics to appear.

Necessity of being not more than 50 vol %: Over 50 of initial resistance increases.

Necessity of being not less than 1 μm diameter: It is difficult to prepare foamable resin powder of less than 1 μm as a working paint, and flocculation takes place so that stress-relief effect against deflection does not appear.

Necessity of not more than 100 μm diameter: For the purpose of connection of electronic components, maximum estimation on thickness does not exceed 1 mm, and to maintain homogeneity in the 1 mm thickness to cause stress-resistant characteristics to appear, holes have to have diameters of not more than 100 μm.

(Embodiment 5)

Similar to Embodiment 1, as the conductive adhesive agent, one-liquid heat and cure type silver adhesive agent which is on the market has been prepared. In addition, filling the pore resin particles with low boiling point hydrocarbon, micro capsules were prepared as the foamable resin powder which would foam at around 100° C. and have average particle diameter of approximately 20 μm. And to the silver adhesive agent the foamable resin powder having 0.1 volume ratio against the quantity of silver has been added and kneading has been conducted again to produce the conductive adhesive agent of Embodiment 5.

Separately from the above-described product, one-liquid heat and cure type silver adhesive agent similar to that described above which is on the market except that resin particles on the surfaces of which were coated with silver were used as conductive adhesive agent was prepared. And to this adhesive agent the foamable resin powder (micro capsules) similar to that describe above has been added so as to attain 0.1 against conductive particle volume (inclusive of resin particle volume), and thus another kind of the conductive adhesive agent of Embodiment 5 was produced.

Using the formed respective conductive adhesive agents, piezoelectric elements were mounted on the substrates. For the purpose of comparison, a sample using a conventional conductive adhesive agent (silver adhesive agent) which does not contain any foamable resin powders has been produced. Incidentally, heat and cure of the adhesive agent has been conducted at 150° C., and foaming of foamable resin powder and curing of the adhesive agent has been conducted simultaneously. At this time, volume expansion ratio of foamable resin powder due to foaming was approximately 20 times.

Drive voltage was repeatedly applied to the mounted piezoelectric elements to conduct load resistance tests.

Based on 10,000 times of load tests, for the samples using the conductive adhesive agents of Embodiment 5, in the case where normal silver particles were used as conductive adhesive agent, together in the case where resin particles coated with silver were used, increase in resistance did not take place and good electro-mechanic conversion characteristics were obtained. On the other hand, for the samples using the conventional conductive adhesive agents, resistance component at joint portions increased and electro-mechanic conversion characteristics deteriorated.

(Embodiment 6)

Similar to Embodiment 1, as the conductive adhesive agent, one-liquid heat and cure type silver adhesive agent which is on the market has been prepared. In addition, filling the pore resin particles with low boiling point hydrocarbon, micro capsules were prepared as the foamable resin powder which would foam at around 120° C. and have average particle diameter of approximately 10 μm. And to the silver adhesive agent the foamable resin powder having 0.05 volume ratio against the quantity of silver has been added and kneading has been conducted again to produce the conductive adhesive agent of Embodiment 6.

On the other hand, separately from that, tantalum porous sintered body being the positive electrode of solid electrolytic capacitor using tantalum was prepared. Dielectric oxide film, and further solid electrolyte have been formed on this sintered body with a general method. Thereafter, carbon paste layer and silver paste layer have been formed in lamination around the periphery of the elements so as to contact the solid electrolyte, and thus key parts of the solid electrolytic capacitor have been formed.

Figure 6:
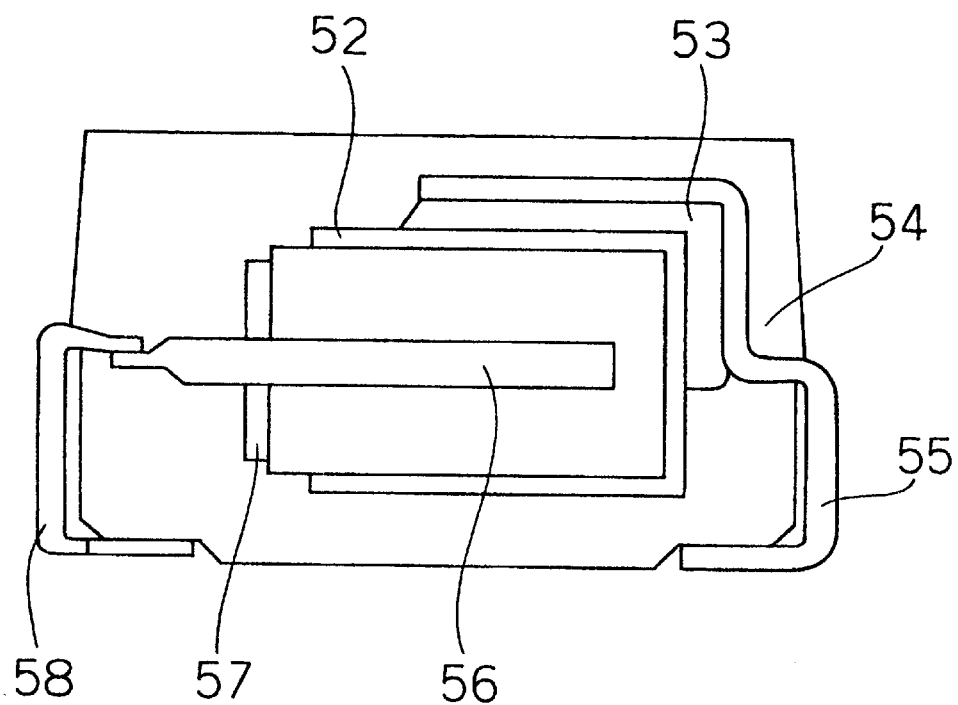
FIG. 6 is a cross-section view showing a capacitor in an embodiment of the present invention.

FIG. 6 is a central cross-section view showing a Ta electrolytic capacitor as an embodiment. Here, the negative electrode layer (the carbon paste layer and the silver paste layer) is denoted as 52, the conductive adhesive agent layer of the present invention is denoted as 53, the exterior resin is denoted as 54, the negative terminal is denoted as 55, the positive electrode lead is denoted as 56, the insulating plate is denoted as 57, and the positive terminal is denoted as 58 and the conductive adhesive agent layer 53 is to connect the negative electrode layer 52 with the negative terminal 55.

Using the formed conductive adhesive agents of Embodiment 6, the negative electrode layer 52 of the key parts of the solid electrolytic capacitor was connected with the negative terminal 55.

For the purpose of comparison, samples using conventional conductive adhesive agents (silver adhesive agents) were produced. Here, heat and cure of the conductive adhesive agent have been conducted at 150° C., and foaming of foamable resin powder and curing has been conducted simultaneously. At this time, volume expansion rate of foamable resin powder due to foaming was approximately 2 to 5 times. As a result of assessment of connection resistance at this point of time, the conventional one as well as the produce of the present invention was left with not more than 2 mΩ.

Here, as in FIG. 6, each sample of capacitor was molded with resin by a normal method, and a solid electrolytic capacitor was completed. At the time of resin-molding, strain is generated due to thermal expansion and shrinkage at each material being used. Due to resin molding, while connection resistance for conventional ones was increased to 5 mΩ, in case of those using conductive adhesive agent of Embodiment 6 no increase in connection resistance was found.

(Embodiment 7)

Similar to Embodiment 1, as the conductive adhesive agent, one-liquid heat and cure type silver adhesive agent which is on the market has been prepared. In addition, filling the pore resin particles with low boiling point hydrocarbon, micro capsules were prepared as the foamable resin powder which would foam at around 120° C. and have average particle diameter of approximately 10 µm. And to the silver adhesive agent the foamable resin powder having 0.05 volume ratio against the quantity of silver has been added and kneading has been conducted again to produce the conductive adhesive agent of Embodiment 7.

On the other hand, separately from that, tantalum porous sintered body being the positive electrode of solid electrolytic capacitor using tantalum was prepared. Dielectric oxide film, and further solid electrolyte have been formed on this sintered body with a general method. Thereafter, carbon paste layer and silver paste layer have been formed in lamination around the periphery of the elements so as to contact the solid electrolyte, and thus key parts of the solid electrolytic capacitor have been formed.

FIG. 4 is a central cross-section view showing a Ta electrolytic capacitor as an embodiment. As described above, the key parts of the solid capacitor having been produced as described above are inserted into a case (generally made of resin) prepared in advance, and after the negative lead formed inside the case is connected with the silver paste layer being the negative internal electrode with the conductive adhesive agent, external terminals are formed at the both poles to configure a capacitor. In FIG. 4, the negative electrode external terminal is denoted as 41, the conductive adhesive agent layer is denoted as 42, the negative electrode lead is denoted as 43, the negative internal electrode is denoted as 44, the positive electrode external terminal is denoted as 45, the case is denoted as 46, the positive internal electrode is denoted as 47, and the sealing resin is denoted as 48.

However, actually an adhesive agent of cure type shrinks at the time of curing, the conductive adhesive agent after curing is not fully filled to give rise to spaces. Accordingly, a conception view will be close to FIG. 5 if roughly expressed to an extreme. In addition, for the purpose of reducing adhesive agent costs, there is a case where local coating is implemented intentionally, giving rise in many cases to the configuration shown in FIG. 5.

In the present embodiment, foamable conductive adhesive agent of the present invention is used at the portion of the conductive adhesive agent layer 42 in FIG. 4.

But, for the conventional example, a normal conductive adhesive agent was used at the portion of the conductive adhesive agent layer 42.

That is, the key parts of the solid capacitor is inserted into a case prepared in advance, the connection with the negative terminal electrode lead having been formed inside the case was implemented by using the produced conductive adhesive agent of Embodiment 6. In this case, the distance between the negative terminal electrode lead and the silver paste layer (the negative internal electrode) of the capacitor key parts will be regulated by the case and a fixed distance will be maintained. Thereafter, sealing was implemented and the external electrodes at the both poles were formed and the capacitor was completed.

For the purpose of comparison, samples using conventional conductive adhesive agents (silver adhesive agents) were produced.

Here, heat and cure of the conductive adhesive agent have been conducted at 150° C., and foaming of foamable resin and curing has been conducted simultaneously. At this time, volume expansion rate of foamable resin powder due to foaming was approximately 2 to 5 times.

As a result of assessment of connection resistance at this point of time, the conventional one was left with 5 mΩ while the resistance of those using the conductive adhesive agents of the present embodiment were all reduced approximately to 2 mΩ or less. Electric connection with good resistance characteristics has been obtained by a foamable resin powder to be contained in the conductive adhesive agent.

(Embodiment 8)

Conventionally, a laminated ceramic capacitor is manufactured by coating a metal paste to become an external electrode at the end portions of the element body obtained by integrally sintering the internal electrodes and the ceramic dielectric layer to undergo printing.

Figure 7:
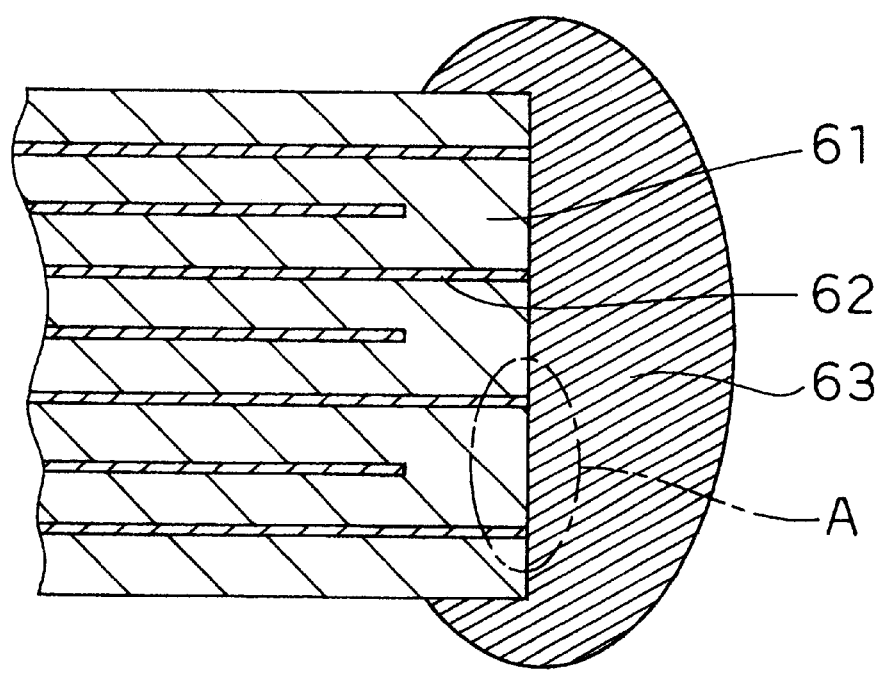
FIG. 7 is a cross-section view showing an external electrode portion of a laminated ceramic capacitor in an embodiment of the present invention.
Figure 8:
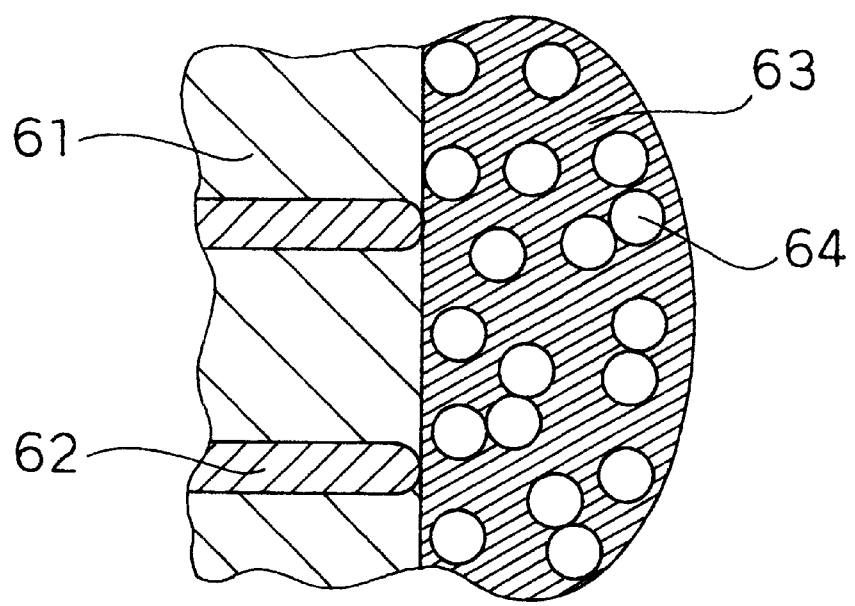
FIG. 8 is a cross-section view showing a partially enlarged external electrode portion of a laminated ceramic capacitor in an embodiment of the present invention.

In the present embodiment, a laminated ceramic capacitor, which was produced by a conventional method as shown in FIG. 7 and FIG. 8, except that the foamable conductive adhesive agent similar to that in Embodiment 6 was coated instead of a metal paste, and underwent foaming and curing to be used as the external electrode 3, was prepared. Here, the dielectric ceramic layer is denoted as 61, the internal electrode is denoted as 62, and the external electrode is denoted as 63. And, as shown in FIG. 8 which is an enlarged drawing of the portion A in FIG. 7, the volume of the pore 64 in the external electrode 63 was approximately 20 vol %. For the purpose of comparison, a laminated ceramic capacitor produced by a conventional method was prepared.

After the external electrodes 63 of the both kinds of capacitor underwent solder plating, they were solder-mounted on a predetermined substrate. Thereafter, the mounted substrate was deflected (the test method went along with JIS C6481, 5.8 Test method for modulus of rupture), and exfoliation from the substrate as well as cracks in the laminated ceramic capacitor were assessed.

As a result of assessment, in the laminated ceramic capacitor of the conventional example, at the time when 20 mm deflection took place, exfoliation of the external electrode and cracks in the capacitor portion occur and therefore capacitance decreased (80 unites among 100 unites). On the other hand, in the embodiment of the present invention, in spite of 20 mm deflection, neither exfoliation nor cracks occurred and capacitance did not decrease in all of 100 unites.

(Embodiment 9)

Figure 9:
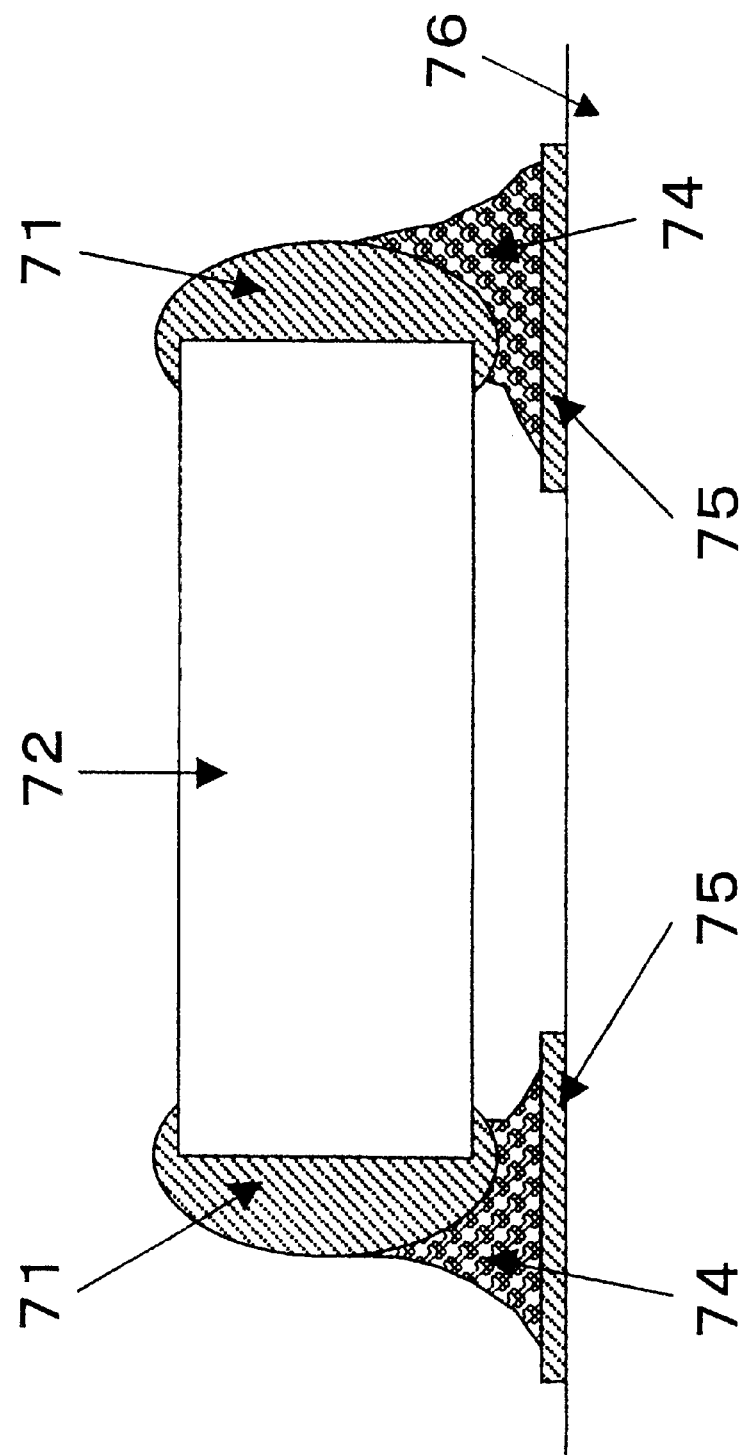
FIG. 9 is a cross-section view showing a mounted body onto a substrate of a laminated ceramic capacitor in an embodiment of the present invention.

A conventional laminated ceramic capacitor was mounted on the substrate using the foamable conductive adhesive agent of the present invention similarly produced as in Embodiment6. FIG. 9 is a cross section view showing how that looks like. Here, the external electrode is denoted as 71, the capacitor key parts element is denoted as 72, the bonded portion formed using the conductive adhesive agent of the present invention is denoted as 74, and the land on the substrate 76 is denoted as 75.

At that time, as in Embodiment 8, the substrate was deflected (the test method went along with JIS C6481, 5.8 Test method for modulus of rupture), and exfoliation from the substrate as well as cracks in the laminated ceramic capacitor were assessed.

As a result of assessment, in the embodiment of the present invention, in spite of 20 mm deflection, neither exfoliation nor cracks occurred and capacitance did not decrease in all of 100 unites.

(Embodiment 10)

Figure 10:
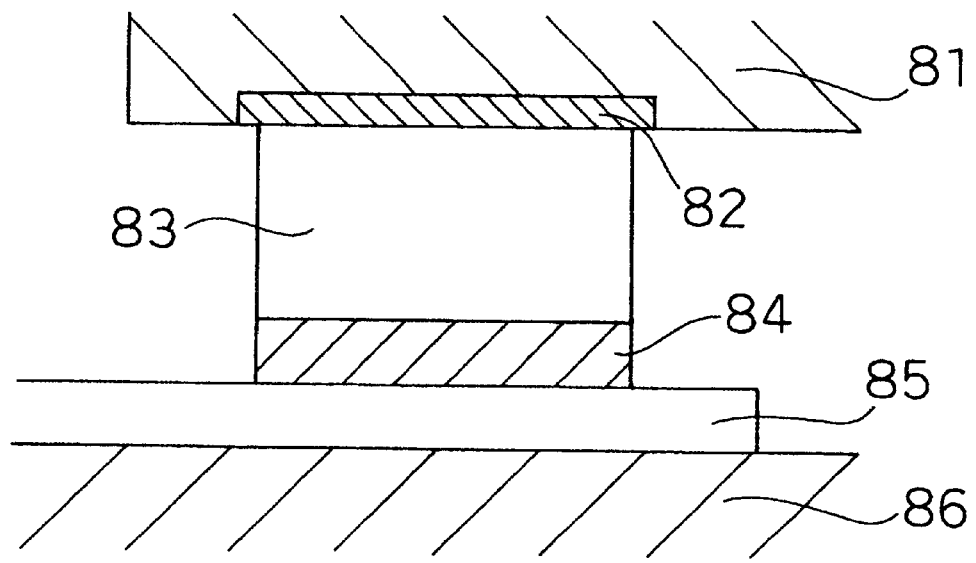
FIG. 10(A) is a cross-section view of a mounted body on a semiconductor substrate in an embodiment of the present invention.
FIG. 10(B) is a cross-section view of a mounted body on a semiconductor substrate in an embodiment of the present invention.
Figure 10:
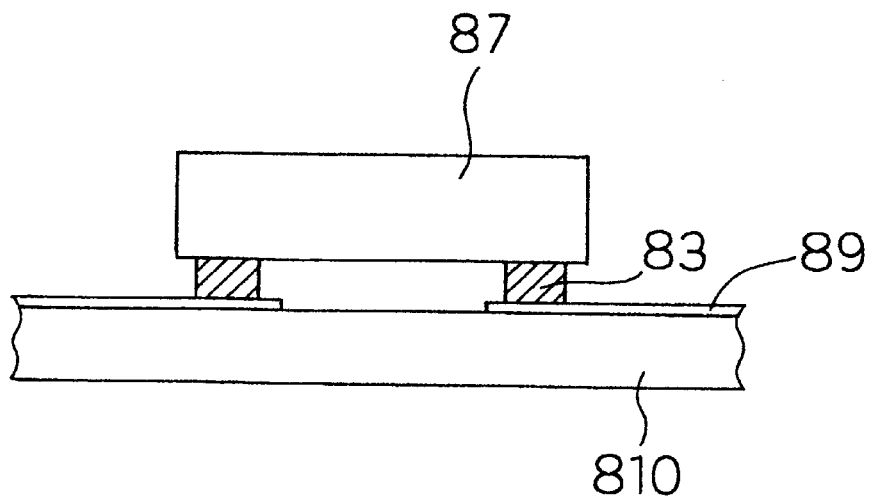

FIGS. 10(A) and (B) are drawings to show how semiconductor devices 81 and 87 are mounted on the substrates 86 and 810. Here, the electrode pad portion is denoted as 82, the bump electrode is denoted as 83, the conductive adhesive agent layer is denoted as 84, and the terminal electrode portions are denoted as 85 and 89. In the present embodiment, the foamable conductive adhesive agent was used to form the conductive adhesive agent layer 84. The foamable resin powder in the adhesive agent with diameter, content ratio, and foaming rate similar to those in Embodiment 6 was used.

In addition, separately the bump electrode 83 itself was formed by using the conductive adhesive agent of the present invention.

In addition, the one with the electrode pad portion 82, which was formed with the conductive adhesive agent of the present invention, was produced.

As a result that electric connection between a device and terminal electrodes was implemented with any one of the above-described three kinds or an combination thereof, a highly deflection-resistant mounted body was obtained and highly reliable electric connection was successfully realized.

In addition, also in the case where the portion of the bump electrode 83 in the configuration in FIG. 10(B) was replaced with the connection by the conductive adhesive agent of the present invention, sufficiently highly reliable electric connection was successfully realized.

Incidentally, in the above-described respective embodiments of the present invention, as conductive adhesive agent, those of heat and cure type were used to confirm their effects, but it goes without saying that similar effects are attainable from those of other cure type by heat treatment to be placed separately.

In addition, it goes without saying that those effects are also attainable by decompression treatment method.

In addition, in the adhesive type ones, resistant characteristic decreases more or less, but it goes without saying that the stress-relief effect is similarly attainable.

In addition, in the above-described each embodiment, as conductive particles, the case where silver particles were used has been shown, but it goes without saying that similar effects are attainable from at least single kind of metal particles selected from gold, copper, tin, indium, palladium, nickel, or lead or any alloy particles of them. In addition, as concerns carbon particles, similar remarks can be made as well, and moreover, it was possible to confirm similar effects in the case where particles which have comprised metal particles, ceramic particles, or resin particles coated with at least single kind of metal selected from gold, silver, copper, tin, indium, palladium, nickel, or lead, or any alloy of them, etc. Especially, difference was not made obvious in Embodiment 5, but the entire adhesive agent layer became more flexible in the case where resin particles coated with metal were used as conductive particles than in the case where the other conductive particles were used, and became capable of following rather huge deformations, and thus, a state of electronic connection with good stress-resistant characteristics could be obtained.

Moreover, in the above-described respective embodiments, a foamable resin powder was added as a content afterwards to an existing conductive adhesive agent, but it goes without saying that the foamable resin powder may be added as a content simultaneously when conductive particles agent and resin are kneaded.

Incidentally, the conductive paste of the present invention was an adhesive agent in the aforementioned embodiment, but is not limited to those for joining a member with another member, but may be other conductive paste, for example, conductive paste for via hole filling to be described as follows.

In addition, configurations in the present invention of foamable materials, conductive members, or resin, etc., are not limited to the aforementioned embodiments, and it is obvious from the above-described explanation that the similar effect is attainable.

Next, embodiments of via hole filling conductive paste according to the present invention will be explained with reference to drawings.

The via hole filling conductive paste in the present embodiment is different from a conventional conductive paste comprising conductive particles and synthetic resin being binder on the aspect that the former contains a foamable materials as the third component of the paste configuring material to expand the volume of the conductive paste when it is heated and cured. That is, the conductive paste for filling via holes related to the present embodiment is configured to comprise copper powder as the conductive particles within a range of 30 to 70 vol % and foamable materials within a range of 0.001 to 40 vol % at a predetermined composition ratio, to which thermal curing epoxy resin as a binder so as to go with the required printing aptitude and in accordance with necessity a solvent have been added.

As the content quantity of conductive particle, a range of the above-mentioned 30 to 70 vol % is preferable, and with less than 30 volt % the contact probability between conductive particles themselves will become small and their resistibility will be increased, and in excess of 70 vol % the binder component in the paste will get less, thus viscosity will increase to make it difficult to proceed with printing. Next, circuit substrates using the thus formulated conductive paste for filling via holes will be explained.

Figure 11:
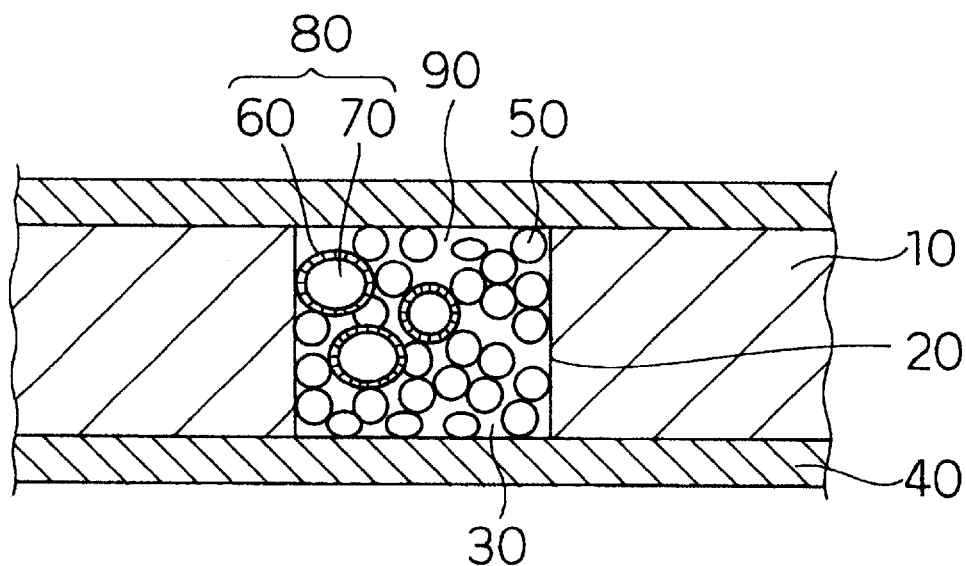
Figure 11:
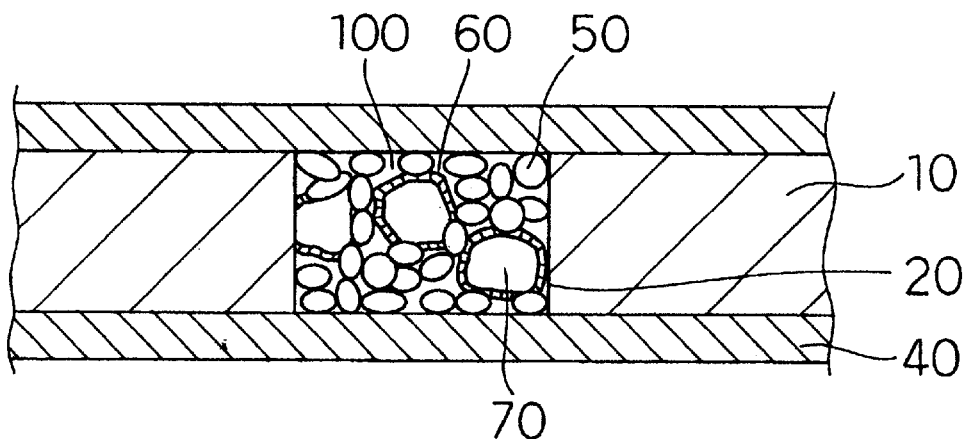

FIG. 11(A) shows a state that an insulating substrate 10 comprises a through hole 20, conductive paste for filling via holes 30 related to the present embodiment, and copper foils 40, wherein through hole 20 which has been disposed at a predetermined position of the insulating substrate 10 has been filled with the conductive paste for filling via holes 30 and copper foils 40 are disposed at the both surfaces of the substrate 10. The conductive paste for filling via holes 30 comprises a conductive particle 50 comprising copper powder, microcapsules 80, and thermal curing resin 90, wherein the microcapsules 80 comprise hollow synthetic resin particles 60 of thermoplastic resin such as vinylidene chloride and acrylic resin, etc. which have been filled inside with gas, liquid, or solid 70 which will volumetric-expand at the time of heating.

In the present embodiment, as the conductive particle 50, a copper powder having the average particle diameter of 0.5 to 20 $\mu$m, its specific surface area of 0.05 to 1.5 m$^2$/g, and oxygen density on the particle surface of not more than 1.0 weight % was utilized and microcapsules 80 in which butane was included as the gas 70 volumetric-expandable at the time of heating were used. As volumetric-expandable gas other than butane, those such as methane and ethane, etc., for low boiling point hydrocarbon can be used. Moreover, as substance volumetric-expandable at the time of heating, other than gas, low boiling point organic solvent family such as alcohol, etc., or sublimation type solid such as camphor and naphthalene, etc. can be used.

FIG. 11(B) shows a state that the epoxy resin 90 was cured subject to this insulating substrate 10 being heated and compressed, and the microcapsules 8 inside which butane gas 70 volumetric-expands with heat, pushes away the epoxy resin 90 still under the pre-cure condition so as to apply strong pressure between copper powder 50 themselves, thus increase its contact surfaces as well as strengthen contact of copper powder 50 with copper foil 40, playing a useful role to reduce the inner resistance of the via hole electric conductor 100. Moreover, since in the via hole filling conductive paste in the present invention, the quantity of content of the conductive particle in the conductive paste can be reduced without increasing its internal resistance compared with the conventional conductive paste, printing performance of the conductive paste can be improved, and in addition, by reducing the quantity to be used of the conductive particle, the cost can be reduced.

In the present embodiment, an example using copper powder as the conductive particle 50 was explained, but otherwise, the similar effect is also attainable by using gold, silver, palladium, nickel, tin, and lead, etc. in the form of single metal powder or alloy powder.

For the purpose of using the technology related to the present invention and attaining the biggest effect, it is preferable to use as conductive particles a metal powder which is comparatively soft, that is, apt to be plastic-deformed to an extent that the deformation is easily conducted by compression at the time when the microcapsules foams to conduct volumetric expansion at the time of heating. In addition, the particle diameters of the conductive particle 50 preferable fall in within the range of 0.2 to 20 $\mu$m so that low specific resistance as well as high connection reliability may be attained. That is, the particle diameter larger than 20 $\mu$m reduces connection area between particles and increase specific resistance, and on the other hand, the particle diameter smaller than 0.2 $\mu$m increases specific surface area thereof and raises paste viscosity, and thus printing characteristics decreases. The specific surface area of the conductive particle 50 should preferably be 0.05 to 1.5 m$^2$/g to make printing characteristics of the paste the most suitable on relation with the above-described particle diameters.

As aforementioned, copper powder has been used as the conductive particle 50 in the present embodiment, but surfaces of copper powder are susceptible to oxidation and therefore it is practically difficult to change the particle surface in a state of metal into a state of paste. However, the oxidized film on the surface of copper powder might get thick, which is a factor to hamper conductivity when the via hole conductor is formed. Accordingly, in the present invention, those with oxygen density of not more than or equal to 1.0 weight % on the copper powder surfaces were used.

Next, the manufacturing method of circuit substrate of the embodiment of the present invention will be explained with reference to FIGS. 12(A) through (D).

Figure 12:
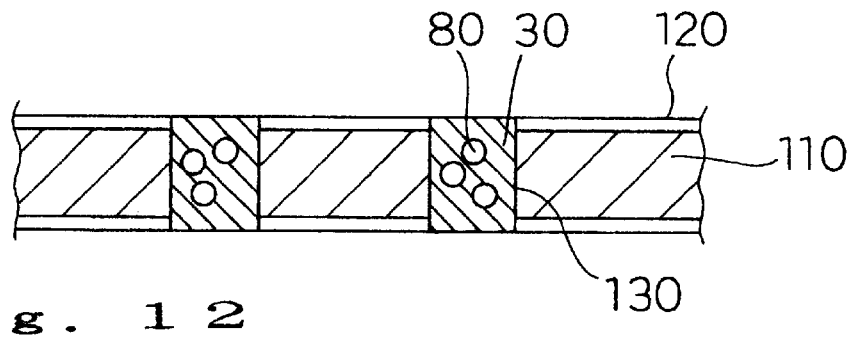
FIGS. 12A–12D are a cross-section views of a partial process explaining the forming method of the circuit substrate the embodiment.
Figure 12:
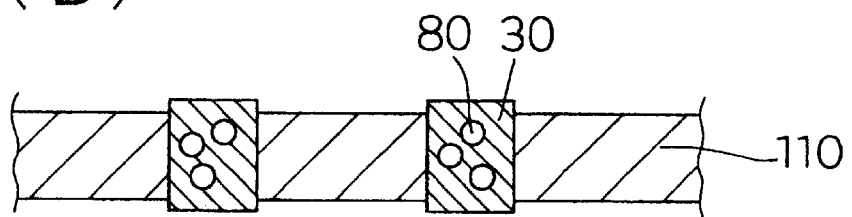
Figure 12:
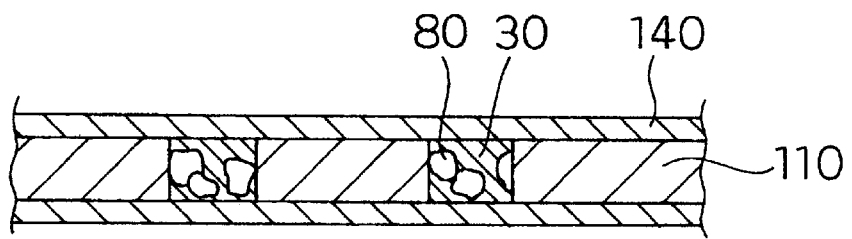
Figure 12:
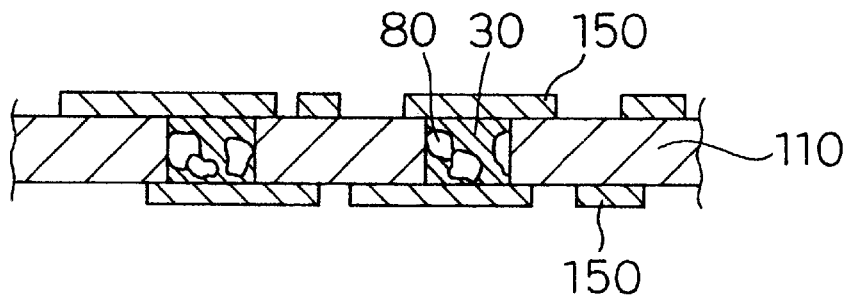

As shown in FIG. 12(A), after organic films 120, for example polyethylene terephthalate, etc., are stuck on the both surfaces of the insulating substrate 110 which was made in a half-cured state by making thermal-cure type resin such as epoxy resin, etc., permeate a fiber basic member such as aramid unwoven fabric, etc., plural through holes 130 are formed in predetermined positions of insulating substrates 110 by laser, etc., and the through holes 130 are filled inside with the via hole filling conductive paste 30 having microcapsules 80 by the printing method.

As shown in FIG. 12(B), after exfoliating the organic films 120, copper foils 140 as shown in FIG. 12(C), are disposed on the both surfaces of insulating substrates 110, and compression as well as heating is applied to the both surfaces to bring the microcapsules 80 into volumetric expansion so as to push the thermal-cure type resin in a liquid state away and simultaneously bring the conductive particles themselves into tight contact by that expansion compression, thus firm conductive pass is formed.

Next, the insulating substrate 110 in half-cured state is cured perfectly and stuck with copper foils 140.

Next, as shown in FIG. 12(D), conventional photolithography method is applied to the copper foil 140 for patterning so that the predetermined wiring 150 may be disposed on the both surfaces, and thus the circuit substrate is formed.

In the present embodiment, as the insulating substrate 110, the example which has been explained is the one where both surface circuit substrate is used, during the course of forming entire layer IVH structure resin multilayer substrate which was made in a half-cured state by making thermal-cure type resin such as epoxy resin, etc., permeate a fiber basic member such as aramid unwoven fabric, etc., but it is possible as well to use glass epoxy substrate or synthetic resin film basic members as the insulating substrate 110. In this case, foaming of microcapsules 80 in the process in FIG. 12(C) is sufficiently attained only by heating, and compression of such level that will not allow internal compression to weaken does well to be applied from the both surfaces of insulating substrates 110. Of course, it is possible to apply more intensive compression, which secures a further firm conductive pass.

It is also possible to form a multilayer wiring circuit substrate by laminating thus formed plural sheets of both-surface wiring circuit substrates.

INDUSTRIAL APPLICABILITY

As apparent from the foregoing explanation, the conductive paste of the present invention has good strain-stress resistant characteristics and low resistance.

In addition, electric connection method using the conductive paste of the present invention can attain a state of electric connection with good stress resistant performance and low resistance.

In addition, the conductive structure of the present invention makes it possible to obtain a conductive structure with low resistance and excellent strain-stress resistant characteristics.

In addition, the conductive paste for filling via holes of the present invention can reduce the internal resistance of the via hole conductor and improve reliability of interlayer connection of the wiring by enlarging the contact surface area between conductive particles themselves in the conductive paste and the contact surface area between the conductive particle and the copper foil to form wiring respectively by internal compression at the time of volumetric expansion of the foamable agent.

Moreover, it becomes possible to reduce content quantity of the conductive particle in the conductive paste, and thus printing performance of the conductive paste is improved to attain better productivity, and reduction of conductive particle's quantity to be used results in an effect on cost reduction as well.

What is claimed is:

1. A conductive paste comprising:
   conductive particles;
   foamable material which foams at the time of heating or decompression; and
   resin, wherein:
      said foamable material is a foamable resin powder;
      said foamable resin powder comprises microcapsules within which a substance expandable by heating or decompression is contained; and
      even after foaming of said foamable material, conductivity is maintained.

2. The conductive paste according to claim 1, wherein the substance expandable by heat or decompression is a hydrocarbon having a low boiling point.

3. The conductive paste according to claim 1, wherein said microcapsules have a particle diameter of not less than 1 μm and not more than 50 μm prior to heating or decompression.

4. The conductive paste according to claim 1, wherein the volume expansion ratio of foaming of said foamable material by said heating or decompression is over 1 time and not more than 100 times.

5. The conductive paste according to claim 1, wherein the quantity of said foamable material in said paste prior to foaming is 0.001 to 0.5 volume ratio per unit quantity of said conductive particles.

6. The conductive paste according to claim 1, wherein, said foaming of said foamable material forms a conductive substrate comprising cavities formed by foaming and said conductive substrate has a volume resistivity of not less than $10^{-6}$ Ω*cm and not more than $10^{-2}$ Ω*cm.

7. The conductive paste according to claim 1, wherein said conductive particles are particles of a metal, carbon particles, or particles on the surface of which said metal is coated.

8. The conductive paste according to claim 7, wherein said conductive paste comprises particles of said metal, and said metal is selected from the group consisting of gold, silver, copper, tin, indium, palladium, nickel, lead, and alloys thereof.

9. The conductive paste according to claim 7, wherein said conductive paste comprises said particles on the surface of which said metal is coated and said metal is selected from the group consisting of gold, silver, copper, tin, indium, palladium, nickel, lead, and alloys thereof.

10. The conductive paste according to claim 7, wherein said particles on the surface of which said metal is coated are particles of said resin.

11. The conductive paste according to any one of claims 1, 7, 2, 3, 10, 5, or 6 wherein said conductive paste is a conductive adhesive agent.

12. The conductive paste according to any one of claims 1, 7, 2, 3, 10, 5, or 6 wherein:
said conductive paste is a conductive paste for filling via holes,
said resin is a thermal-cure resin, and
said paste comprises said conductive particles and said thermal-cure resin as principal ingredients.

13. The conductive paste according to claim 12, wherein said metal is selected from the group consisting of gold, silver, palladium, copper, nickel, tin, lead, and indium, and alloys thereof, and said particles have an average diameter of 0.5 to 20 μm and a specific surface area of 0.05 to 1.5 m²/g.

14. The conductive paste according to claim 13, wherein said metal is copper and the surface oxygen density of said particles is not more than 1.0 weight %.

15. The conductive paste according to claim 12, wherein said thermal curing resin is a thermal curing epoxy resin composition.

16. A circuit substrate comprising:
an insulating substrate having through holes;
a wiring pattern formed on the surface of said insulating substrate; and
a via hole conductor filling said through holes to electrically connect said wiring pattern formed on the both surfaces or at a multiple lamination structure of said insulating substrate,
characterized in that the conductive paste according to claim 12 is used for forming as said via hole conductor.

17. The circuit substrate according to claim 16, wherein said insulating substrate is a synthetic resin film, a woven fabric substrate permeated by a resin in a half-cured state, or an unwoven fabric substrate.

18. The circuit substrate according to claim 17, wherein said resin that permeates said woven fabric is an aramid epoxy resin or a glass epoxy resin.

19. A circuit substrate manufacturing method comprising at least the steps of:
disposing plural through holes in an insulating substrate;
filling a conductive paste for filling via holes according to claim 12 in said through holes;
disposing copper foils on the both sides of said insulating substrate and thereafter making foamable agent in said conductive paste for filling via holes volumetric-expand with heating and pressure;
curing the conductive paste; and
forming a wiring pattern by etching said copper foil into a predetermined pattern shaped.

20. The circuit substrate manufacturing method according to claim 19, wherein said insulating substrate is a synthetic resin film, a woven fabric substrate permeated by a resin in a half-cured state, or an unwoven fabric substrate.

21. The circuit substrate manufacturing method according to claim 20, wherein said resin that permeates said woven fabric is an aramid epoxy resin or a glass epoxy resin.

22. A conductive structure electrically connected with a predetermined location, wherein the conductive structure comprises a number of substantial cavities formed by foaming of foamable material.

23. The conductive structure according to claim 22, wherein said conductive structure comprising said number of substantial cavities is formed by heating or decompressing a conductive paste comprising:
conductive particles;
foamable material which foams at the time of heating or decompression; and
resin,
wherein even after foaming of said foamable material, conductivity is maintained.

24. The conductive structure according to claim 22, wherein the conductive structure comprising a number of substantial cavities formed by foaming comprises cavities of not less than 1 μm and not more than 100 μm in 3 to 50 vol %.

25. The conductive structure according to claim 22, wherein said conductive structure comprising a number of substantial cavities formed by foaming has volume resistivity of not less than $10^{-6}$ Ω*cm and not more than $10^{-2}$ Ω*cm.

26. A ceramic electronic component comprising an internal electrode,
wherein an external electrode portion, which is electrically connected with said internal electrode and formed at an end portion, comprises the conductive structure according to claim 23.

27. An electronic component of casing type or mold type comprising an internal electrode which is electrically connected with an external electrode via a conductor,
wherein a conductor connecting said internal electrode with an external electrode or with a lead electrode electrically connected with an external electrode each other comprises the conductive structure according to claim 23.

28. A mounted body in which an electronic component is electrically connected with a substrate, wherein said connection portion comprises the conductive structure according to claim 23.

29. The mounted body according to claim 28, wherein said electronic component is a semiconductor device.

30. A manufacturing method of a ceramic electronic component comprising an internal electrode, comprising the steps of:
   coating a predetermined location at an end portion where said internal electrode is exposed, with the conductive paste according to claim 1; and
   forming an external electrode portion by causing foamable material contained in said conductive paste to foam by heating or decompressing said conductive paste.

31. An electric connection method using conductive paste, comprising the steps of connecting a predetermined location with another predetermined location other than that location by using the conductive paste according to any one of claims 1, 2 or 3–9; and
   causing foamable material contained in said conductive paste to foam by heating or decompressing the conductive paste.

32. The electric connection method according to claim 31, wherein curing of said conductive paste takes place simultaneously in said foaming step.

33. The electric connection method according to claim 31, comprising a step of curing of conductive paste after said foaming step.

34. The electric connection method according to claim 33, wherein said foaming step is implemented at a predetermined temperature, and in said curing step, curing is implemented at a temperature higher than said predetermined temperature.

35. The electric connection method according to claim 31, wherein said predetermined location is a predetermined location of an electronic component and said another location is a predetermined location of a substrate.

36. The electric connection method according to claim 35, wherein said electronic component is a semiconductor device.

37. The electric connection method according to claim 31, wherein:
   said predetermined location is an internal electrode of an electronic component of casing type or mold type which comprises internal electrodes being electrically connected with external electrodes via a conductor; and
   said another predetermined location is said external electrode or a lead electrode which is electrically connected with said external electrode.

38. A conductive paste comprising:
   conductive particles;
   foamable material which foams at the time of heating or decompression; and
   resin,
   wherein:
      even after foaming of said foamable material, conductivity is maintained, and
      said foaming of said foamable material forms a conductive substrate comprising cavities formed by foaming and said conductive substrate has a volume resistivity of not less than $10^{-6}$ $\Omega$*cm and not more than $10^{-2}$ $\Omega$*cm.

39. The conductive paste according to claim 38, wherein said conductive particles are particles of a metal, carbon particles, or particles on the surface of which said metal is coated; said metal is selected from the group consisting of gold, silver, palladium, copper, nickel, tin, lead, and indium, and alloys thereof, and said particles have an average diameter of 0.5 to 20 $\mu$m and a specific surface area of 0.05 to 1.5 m$^2$/g.

\* \* \* \* \*

UNITED STATES PATENT AND TRADEMARK OFFICE
CERTIFICATE OF CORRECTION

PATENT NO.    : 6,479,763 B1                                    Page 1 of 1
DATED         : November 12, 2002
INVENTOR(S)   : Igaki et al.

It is certified that error appears in the above-identified patent and that said Letters Patent is hereby corrected as shown below:

Column 21,
Lines 36 and 39, after "3" insert -- 4, 8, 9 --.

Column 23,
Line 20, delete "1, 2 or 3-9" and insert -- 1, 7, 2, 3, 4, 8, or 9 --.

Signed and Sealed this

Second Day of September, 2003

JAMES E. ROGAN
*Director of the United States Patent and Trademark Office*